United States Patent
Lee et al.

(10) Patent No.: US 8,969,178 B2
(45) Date of Patent: Mar. 3, 2015

(54) METHOD OF MANUFACTURING LARGE AREA GALLIUM NITRIDE SUBSTRATE

(71) Applicant: Samsung Electronics Co., Ltd., Suwon-Si, Gyeonggi-Do (KR)

(72) Inventors: Moon-sang Lee, Seoul (KR); Sung-soo Park, Seongnam-si (KR); Young-soo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 81 days.

(21) Appl. No.: 13/743,634

(22) Filed: Jan. 17, 2013

(65) Prior Publication Data

US 2014/0073115 A1   Mar. 13, 2014

(30) Foreign Application Priority Data

Sep. 13, 2012 (KR) .................. 10-2012-0101806

(51) Int. Cl.
*H01L 21/02* (2006.01)

(52) U.S. Cl.
CPC .... *H01L 21/02263* (2013.01); *H01L 21/02002* (2013.01); *H01L 21/02381* (2013.01); *H01L 21/02439* (2013.01); *H01L 21/02458* (2013.01); *H01L 21/02505* (2013.01); *H01L 21/0254* (2013.01); *H01L 21/0262* (2013.01); *H01L 21/02642* (2013.01)
USPC ........................................ 438/478

(58) Field of Classification Search
None
See application file for complete search history.

(56) References Cited

U.S. PATENT DOCUMENTS

| | | |
|---|---|---|
| 6,239,045 B1 | 5/2001 | Tanaka et al. |
| 2005/0059229 A1 | 3/2005 | Minemoto et al. |
| 2007/0164298 A1* | 7/2007 | Kim et al. ............ 257/94 |
| 2011/0309237 A1 | 12/2011 | Seo et al. |
| 2011/0309378 A1 | 12/2011 | Lau et al. |
| 2011/0316120 A1 | 12/2011 | Rogers et al. |
| 2012/0000415 A1 | 1/2012 | D'Evelyn et al. |
| 2012/0021250 A1 | 1/2012 | Lee et al. |
| 2012/0021545 A1 | 1/2012 | Hung et al. |
| 2012/0028446 A1 | 2/2012 | Cheng et al. |
| 2012/0028465 A1 | 2/2012 | Kosaka |
| 2012/0037919 A1 | 2/2012 | Xu et al. |
| 2012/0043593 A1 | 2/2012 | Zhong et al. |
| 2012/0057392 A1 | 3/2012 | Chrzan et al. |
| 2012/0063481 A1 | 3/2012 | Nagatomo |
| 2012/0068153 A1 | 3/2012 | Seong et al. |
| 2012/0070576 A1 | 3/2012 | Groenen et al. |
| 2012/0074449 A1 | 3/2012 | Park et al. |
| 2012/0080698 A1 | 4/2012 | Chu et al. |
| 2012/0086021 A1 | 4/2012 | Wang |
| 2012/0091406 A1 | 4/2012 | Jang et al. |
| 2012/0107979 A1 | 5/2012 | Moon et al. |
| 2012/0129682 A1 | 5/2012 | Yun et al. |

FOREIGN PATENT DOCUMENTS

| | | |
|---|---|---|
| JP | 2002316893 A | 10/2002 |
| KR | 10-2004-0031284 A | 4/2004 |
| KR | 1020050041185 A | 5/2005 |

(Continued)

*Primary Examiner* — Seahvosh Nikmanesh
(74) *Attorney, Agent, or Firm* — Harness, Dickey & Pierce, P.L.C.

(57) ABSTRACT

A method of manufacturing a large area gallium nitride (GaN) substrate includes forming a buffer layer on a silicon substrate, forming an insulation layer pattern on a rim of a top surface of the buffer layer, growing a GaN layer on the buffer layer, and removing the insulation layer pattern and a portion of the GaN layer and the silicon substrate.

10 Claims, 4 Drawing Sheets

(56) References Cited

FOREIGN PATENT DOCUMENTS

| | | |
|---|---|---|
| KR | 10-2006-0019614 A | 3/2006 |
| KR | 102009005135 A | 5/2009 |
| KR | 1020090081693 A | 7/2009 |
| KR | 1020090094516 A | 9/2009 |
| KR | 1020100000781 A | 1/2010 |
| KR | 1020110056866 A | 5/2011 |
| WO | WO-2010002694 A2 | 1/2010 |

* cited by examiner

METHOD OF MANUFACTURING LARGE AREA GALLIUM NITRIDE SUBSTRATE

CROSS-REFERENCE TO RELATED APPLICATIONS

This application claims the benefit of Korean Patent Application No. 10-2012-0101806, filed on Sep. 13, 2012, in the Korean Intellectual Property Office, the disclosure of which is incorporated herein in its entirety by reference.

BACKGROUND

1. Field

Some example embodiments relate to methods of manufacturing a gallium nitride (GaN) substrate on a large area silicon substrate.

2. Description of the Related Art

Gallium nitride (GaN) is a direct energy-gap semiconductor that has bandgap energy of about 3.39 eV, and thus, GaN is useful in manufacturing a light-emitting device in a short wavelength domain.

Due to a high nitrogen vapor pressure at a melting point, a liquid crystal growth of a GaN single crystal requires a relatively high temperature equal to or higher than about 1500° C. and a nitrogen atmosphere of about 20,000 atmosphere. Thus, it is not only difficult to mass-produce the GaN single crystal, but also to use the GaN single crystal in manufacturing a device since a current usable crystal size of the GaN single crystal is about 100 mm$^2$.

A GaN thin film may be grown on a heterogeneous substrate by using a metal organic chemical vapor deposition (MOCVD) method or a hydride vapor phase epitaxy (HVPE) method.

A GaN substrate may be manufactured by growing a GaN layer on a sapphire substrate and then removing the sapphire substrate. However, it is difficult to prepare a sapphire substrate having a diameter equal to or higher than about 6 inches, and the sapphire substrate is expensive. Thus, it is difficult to use the sapphire substrate to manufacture a large area GaN substrate.

Accordingly, a method of growing a GaN layer by using a large area silicon substrate is being developed. However, when the GaN layer is grown on the large area silicon substrate, silicon may diffuse into GaN to thus etch a surface of the large area silicon substrate and cause a meltback if silicon and GaN directly contact each other, and a tensile stress may be generated in the GaN layer, thereby generating cracks in the GaN layer due to differences between thermal expansion coefficients and lattice constants between silicon and GaN.

SUMMARY

Some example embodiments provide methods of manufacturing a large area gallium nitride (GaN) substrate by using a large area silicon substrate as a heterogeneous substrate. Additional aspects will be set forth in part in the description which follows and, in part, will be apparent from the description, or may be learned by practice of example embodiments.

According to an example embodiment, a method of manufacturing a large area gallium nitride (GaN) substrate includes forming a buffer layer on a silicon substrate, forming an insulation layer pattern on a rim of a top surface of the buffer layer, growing a GaN layer on the buffer layer, and removing the insulation layer pattern and corresponding portions of the GaN layer and the silicon substrate.

The buffer layer may be formed by using a metal organic chemical vapor deposition (MOCVD) method. The buffer layer may be formed of at least one of a single layer of any one of aluminum nitride (AlN), tantalum nitride (TaN), titanium nitride (TiN), hafnium nitride (HfN), GaN, and aluminum gallium nitride (AlGaN), and a triple layer of AlN, AlGaN, and GaN.

Forming the insulation layer pattern may include forming a silicon oxide layer on the buffer layer, and patterning the silicon oxide layer. The insulation layer pattern may be formed of one of silicon oxide, silicon nitride, alumina, and hafnium oxide. A thickness of the insulation layer pattern may be from about 5 μm to about 2 mm. A width of the insulation layer pattern may be from about 0.5 mm to about 5 mm.

The GaN layer may be grown by using a hydride vapor phase epitaxy (HVPE) method. The GaN layer may be grown at a temperature from about 950° C. to about 1100° C. The method may further include removing the silicon substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
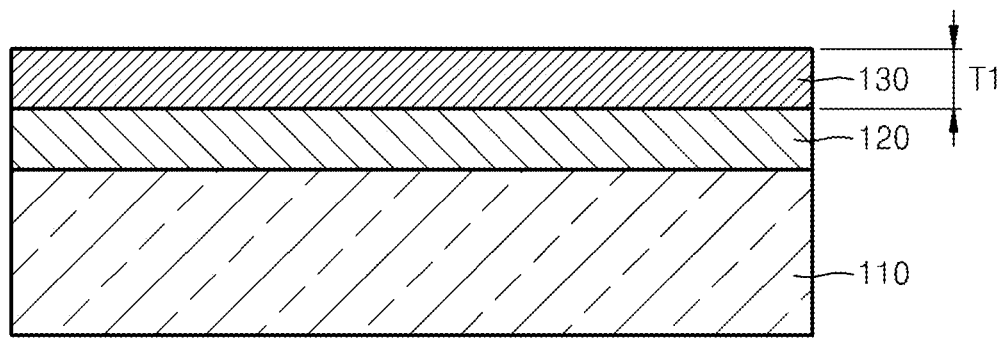
FIGS. 1A through 1D are cross-sectional views for describing a method of manufacturing a large area gallium nitride (GaN) substrate, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. In drawings, thicknesses of layers or regions may be exaggerated for clarity, and when a component is disposed "on" or "above" another component, the component may be disposed directly on the other component or an intervening component may exist.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

FIGS. 1A through 1D are cross-sectional views for describing a method of manufacturing a large area gallium nitride (GaN) substrate 100, according to an example embodiment.

Referring to FIG. 1A, a large area silicon substrate 110 is prepared. The large area silicon substrate 110 may have a thickness from about 100 μm to about 1000 μm, and a diameter from about 6 inches to 18 inches. Since a diameter of the large area GaN substrate is determined by the diameter of the large area silicon substrate 110, the large area silicon substrate 110 is prepared to manufacture the large area GaN substrate.

However, the method according to an example embodiment is not limited to using a silicon substrate having a diameter of 6 inches or above, and a small area GaN substrate may be manufactured by using a small area silicon substrate.

A buffer layer 120 is formed on the large area silicon substrate 110. The buffer layer 120 is formed of a material having a relatively small difference in lattice constant from a GaN layer grown thereon. The buffer layer 120 is used to prevent or inhibit a meltback. The meltback is a phenomenon that occurs when a surface of the large area silicon substrate 110 is etched as silicon diffuses into GaN when silicon and GaN directly contact each other while growing GaN on the large area silicon substrate 110.

The buffer layer 120 may be formed of any one of aluminum nitride (AlN), tantalum nitride (TaN), titanium nitride (TiN), hafnium nitride (HfN), GaN, and aluminum gallium nitride (AlGaN), or formed as a triple layer of AlN, AlGaN, and GaN. The buffer layer 120 may have a thickness from about 5 nm to about 50 μm. The buffer layer 120 is used for epitaxial growth of a GaN layer thereon. The buffer layer 120 may be formed by using a metal organic chemical vapor deposition (MOCVD) method.

Figure 2:
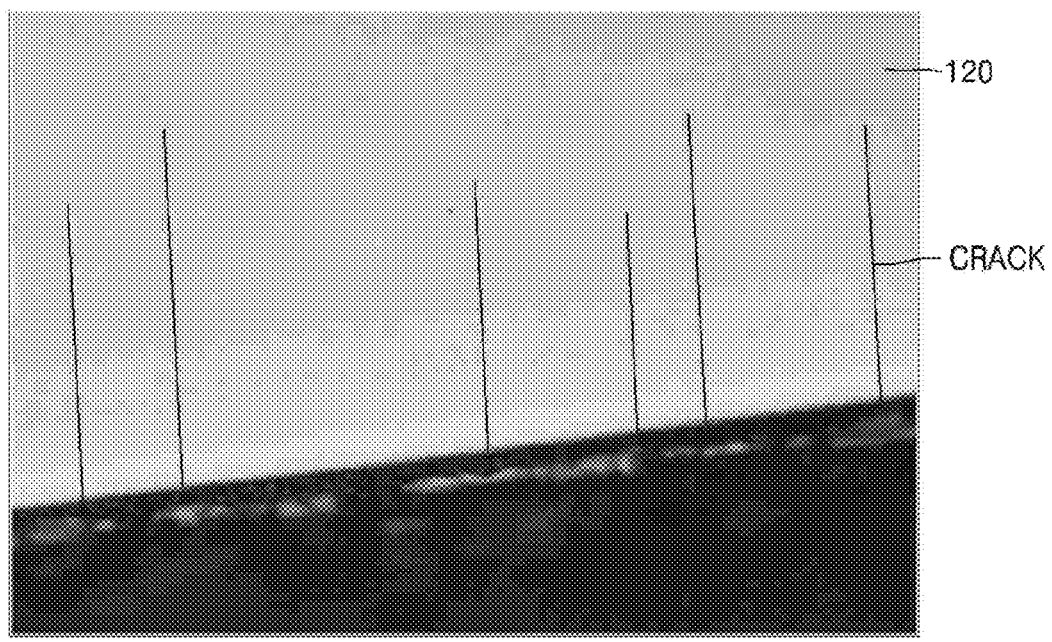
FIG. 2 is a microscopic image showing cracks formed on an edge of a buffer layer on a silicon substrate.

As shown in FIG. 2, when the buffer layer 120 formed of AlN is formed on the large area silicon substrate 110 by using the MOCVD method, a crack is generated in an edge of the buffer layer 120. For convenience of description, the crack is shown as a thick line in FIG. 2.

When a GaN layer is formed on the buffer layer 120 having a crack, silicon may diffuse into the GaN layer through the crack, and thus a bottom surface of the large area silicon substrate 110 may be etched, thereby generating a meltback.

Referring back to FIG. 1A, an insulation layer 130 having a predetermined or given thickness is formed on the buffer layer 120. The insulation layer 130 may be formed by using a CVD method, a sputtering method, or an evaporation method. A thickness T1 of the insulation layer 130 may be from about several nm to dozens of μm. The insulation layer 130 may be formed of silicon oxide, silicon nitride, alumina, or hafnium oxide.

Figure 1B:
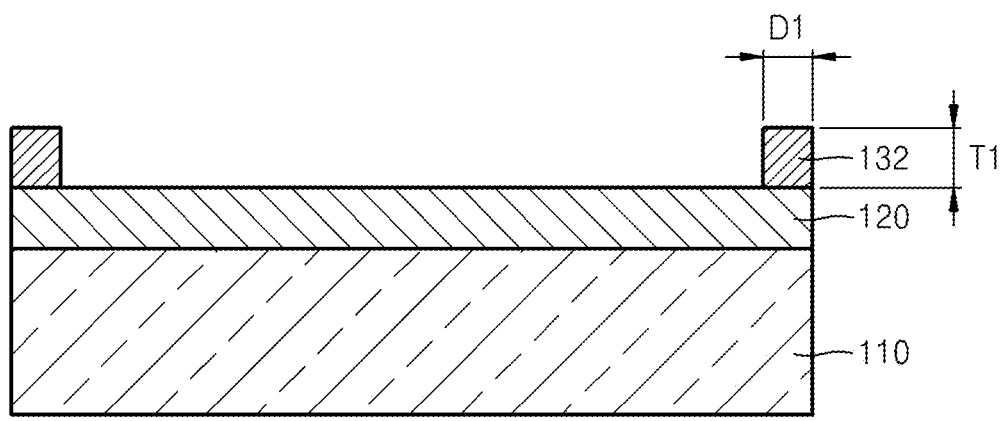

Referring to FIG. 1B, an insulation layer pattern 132 is formed on a rim region on a top surface of the buffer layer 120 by patterning the insulation layer 130 by photolithography of a semiconductor process. The insulation layer pattern 132 may have an annular circle. The insulation layer 130 may be patterned by wet etching or dry etching. A width D1 of the insulation layer pattern 132 may be from about 0.5 mm to about 5 mm. The insulation layer pattern 132 is formed to cover a crack formed in the rim region of the top surface of the buffer layer 120.

Figure 1C:
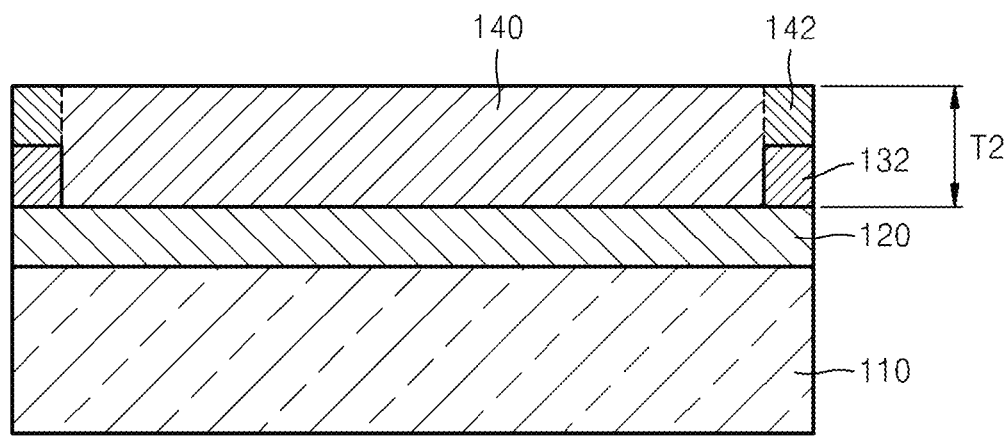

Referring to FIG. 1C, a GaN layer 140 may be grown on the buffer layer 120 by using a hydride vapor phase epitaxy (HVPE) method. Since GaN grows faster by using the HVPE method than the MOCVD method, the HVPE method may be used to grow a large area and thick GaN layer. The GaN layer 140 may be grown on the buffer layer 120 by forming gallium chloride (GaCl) by reacting hydrogen chloride (HCl) and Ga metal in an HVPE reactor, and then reacting GaCl and ammonia ($NH_3$).

A growth temperature of the GaN layer 140 may be from about 950° C. to about 1100° C. A thickness T2 of the GaN layer 140 may be from about 5 μm to about 2 mm.

The GaN layer 140 of single crystal is grown on the buffer layer 120 by using the HVPE method, but a GaN layer 142 of polycrystal is formed on the insulation layer 130.

Figure 1D:
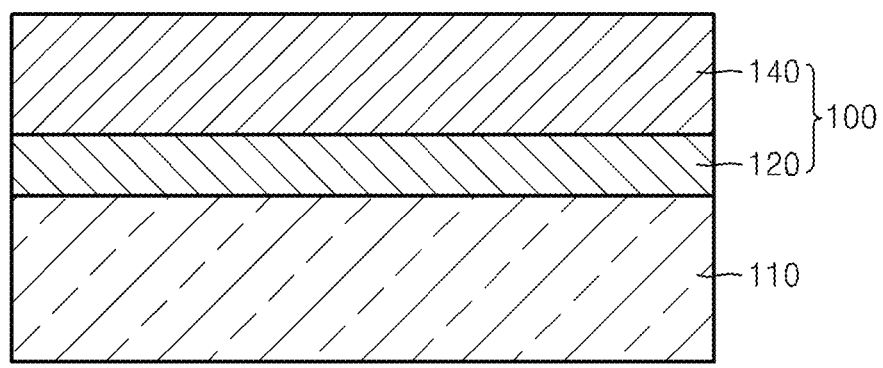

Referring to FIG. 1D, the GaN layer 140 and the GaN layer 142 are more easily detached from each other. In other words, the GaN layer 142 may be more easily detached from the GaN layer 140. Here, the GaN layer 142 on the insulation layer pattern 132 and a corresponding region of the large area silicon substrate 110 below the insulation layer pattern 132 may be more easily detached.

When the large area silicon substrate 110 is removed from the resultant by wet etching or dry etching, the freestanding large area GaN substrate 100 is obtained.

Figure 3:
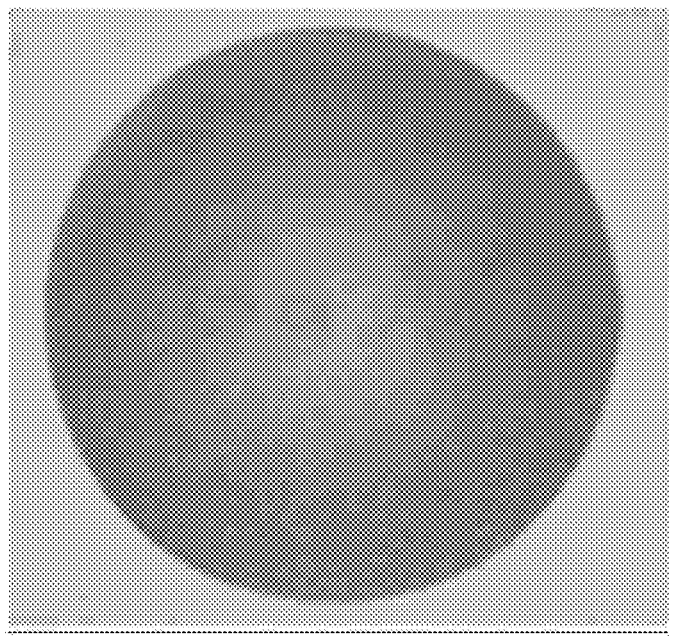
FIG. 3 is a photo showing a surface of a GaN substrate grown according to an example embodiment.
Figure 4:
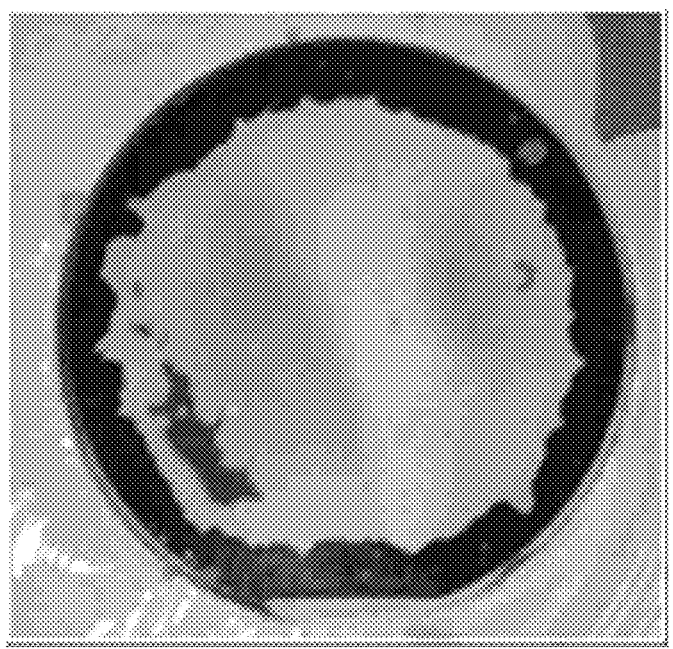
FIG. 4 is a photo showing a meltback formed on a rim of a silicon substrate when a GaN layer is grown without an insulation layer pattern.

FIG. 3 is a photo showing a surface of a GaN substrate grown according to an example embodiment, and FIG. 4 is a photo showing a meltback formed on a rim region of a silicon substrate when a GaN layer is grown without an insulation layer pattern. In FIG. 4, a black region illustrates a meltback.

Referring to FIG. 3, it shows that a meltback is not formed on the GaN substrate, specifically at a rim of the GaN substrate, because an insulation layer pattern according to an example embodiment prevents or inhibits silicon of a silicon substrate from being diffused into a GaN layer through a crack formed in a buffer layer.

As described above, according to one or more of the above example embodiments, a large area GaN substrate having a desirable quality may be manufactured on a silicon substrate by forming an insulation layer pattern on a rim region of a buffer layer where a crack is generally generated, and preventing or inhibiting a meltback caused by the crack.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a large area gallium nitride (GaN) substrate, the method comprising:
    forming a buffer layer on a silicon substrate;
    forming an insulation layer pattern on a rim of a top surface of the buffer layer;
    growing a GaN layer on the buffer layer, the GaN layer including a single crystal GaN layer adjacent to a side surface of the insulation layer pattern and a polycrystalline GaN layer on a top surface of the insulation layer pattern; and
    removing the insulation layer pattern, the polycrystalline GaN layer on the top surface of the insulation layer pattern and corresponding portions of the buffer layer and the silicon substrate under the insulation layer pattern.

2. The method of claim 1, wherein the forming of the buffer layer includes using a metal organic chemical vapor deposition (MOCVD) method.

3. The method of claim 1, wherein the forming of the buffer layer includes forming at least one of a single layer of any one of aluminum nitride (AlN), tantalum nitride (TaN), titanium nitride (TiN), hafnium nitride (HfN), GaN, and aluminum gallium nitride (AlGaN), and a triple layer of AlN, AlGaN, and GaN.

4. The method of claim 1, wherein the forming of the insulation layer pattern comprises:
    forming a silicon oxide layer on the buffer layer; and
    patterning the silicon oxide layer.

5. The method of claim 1, wherein the forming of the insulation layer pattern includes forming one of silicon oxide, silicon nitride, alumina, and hafnium oxide.

6. The method of claim 1, wherein the growing of the GaN layer includes growing the GaN layer to a thickness from about 5 μm to about 2 mm.

7. The method of claim 1, wherein the forming of the insulation layer pattern includes forming the insulation layer pattern to a width of from about 0.5 mm to about 5 mm.

8. The method of claim 1, wherein the growing of the GaN layer includes using a hydride vapor phase epitaxy (HVPE) method.

9. The method of claim 8, wherein the growing of the GaN layer includes growing the GaN layer at a temperature from about 950° C. to about 1100° C.

10. The method of claim 1, further comprising:
    removing the silicon substrate.

* * * * *